(12) United States Patent
Maeda

(10) Patent No.: US 6,242,149 B1
(45) Date of Patent: Jun. 5, 2001

(54) FAST-CURING PHOTOSENSITIVE COMPOSITION AND RECORDING SHEET

(75) Inventor: Minobu Maeda, Kounan (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 0 days.

(21) Appl. No.: 09/210,943

(22) Filed: Dec. 15, 1998

(30) Foreign Application Priority Data

Dec. 22, 1997 (JP) .................................................... 9-365770

(51) Int. Cl.$^7$ .............................. G03C 1/73; G03C 1/735; G03C 1/76; C08F 2/48; B32B 5/16

(52) U.S. Cl. .................. 430/138; 430/281.1; 430/285.1; 430/271.1; 522/180; 522/66; 428/402.2; 428/402.21

(58) Field of Search .............................. 430/281.1, 285.1, 430/138; 428/402.2, 402.21; 522/180, 66

(56) References Cited

U.S. PATENT DOCUMENTS

| | | | |
|---|---|---|---|
| Re. 28,789 | 4/1976 | Chang | 430/275.1 |
| 2,800,457 | 7/1957 | Green et al. | 428/402.2 |
| 2,800,458 | 7/1957 | Green | 428/402.2 |
| 3,418,118 | 12/1968 | Thommes et al. | 430/281.1 |
| 3,479,185 | 11/1969 | Chambers, Jr. | 430/278.1 |
| 3,652,275 | 3/1972 | Baum et al. | 430/269 |
| 4,089,802 | 5/1978 | Foris et al. | 427/213.34 |
| 4,162,162 | 7/1979 | Dueber | 430/288.1 |
| 4,985,470 | 1/1991 | Nagasaka et al. | 522/26 |
| 5,019,483 | * 5/1991 | Lin et al. | 430/285.1 |
| 5,047,442 | 9/1991 | Sasaki et al. | 522/27 |
| 5,100,756 | * 3/1992 | Kobayashi | 430/281.1 |
| 5,194,365 | * 3/1993 | Goodin et al. | 430/327 |

FOREIGN PATENT DOCUMENTS

| | | |
|---|---|---|
| 44 40 819 A1 | 5/1995 | (DE) . |
| 0 338 616 A1 | 10/1989 | (EP) . |
| 0 359 934 A1 | 3/1990 | (EP) . |
| 0 498 618 A1 | 8/1992 | (EP) . |
| 952807 | 3/1964 | (GB) . |
| 965074 | 7/1964 | (GB) . |
| 36-9168 | 6/1961 | (JP) . |
| 38-19574 | 9/1963 | (JP) . |
| 42-446 | 1/1967 | (JP) . |
| 42-771 | 1/1967 | (JP) . |
| 44-20189 | 8/1969 | (JP) . |
| 45-37377 | 11/1970 | (JP) . |
| 47-2528 | 2/1972 | (JP) . |
| 48-84183 | 11/1973 | (JP) . |
| 51-9079 | 1/1976 | (JP) . |
| 52-134692 | 11/1977 | (JP) . |
| 54-151024 | 11/1979 | (JP) . |
| 54-155292 | 12/1979 | (JP) . |
| 57-21401 | 2/1982 | (JP) . |
| 58-19315 | 2/1983 | (JP) . |
| 58-29803 | 2/1983 | (JP) . |
| 58-40302 | 3/1983 | (JP) . |
| 59-56403 | 3/1984 | (JP) . |
| 60-32801 | 2/1985 | (JP) . |
| 61-258802 | 11/1986 | (JP) . |
| 61-258803 | 11/1986 | (JP) . |
| 1-279903 | 11/1989 | (JP) . |

OTHER PUBLICATIONS

Nippon Ganryo Gijutsu Kyokai, Saishin Ganryo Binran (Translation: Pigment Handbook up to Date), pp. 1–10, 1977.

* cited by examiner

*Primary Examiner*—Hoa Van Le
*Assistant Examiner*—Sin J. Lee
(74) *Attorney, Agent, or Firm*—Oliff & Berridge, PLC

(57) ABSTRACT

The fast-curing photosensitive composition capable of being cured by the irradiation with light, comprises a radical-polymerizable unsaturated compound, a photopolymerization initiator, and a thiol-containing compound, whereby the fast-curing photosensitive composition can be adequately cured even with low exposure energy.

16 Claims, No Drawings

FAST-CURING PHOTOSENSITIVE COMPOSITION AND RECORDING SHEET

BACKGROUND OF THE INVENTION

1. Field of the Invention

The present invention relates to a fast-curing photosensitive composition that remains sensitive up to the visible range and that is used in recording inks, materials encapsulated inside photocuring microcapsules for image recording, photosensitive coating compositions, and the like; and to a recording sheet obtained using microcapsules inside which the fast-curing photosensitive composition is encapsulated.

2. Related Art of the Invention

Many conventional photosensitive compositions for image recording and the like are irradiated with lasers or the like, and are cured with the light energy thus produced. Many of these compositions are comprised of photopolymerization initiators (such as aromatic carbonyl compounds) and radical-polymerizable unsaturated compounds containing ethylenic unsaturated groups.

Photosensitive recording sheets are also known. These sheets are obtained by coating supports such as paper and resin films with photosensitive compositions or photosensitive microcapsules obtained by encapsulating such photosensitive compositions inside light-transmitting microcapsules.

Such photosensitive recording sheets are irradiated with light in accordance with image information, latent images are formed by allowing solely the regions irradiated with light to undergo curing, the recording sheet containing the latent images thus formed is then pressed or otherwise mechanically worked, and the uncured microcapsules are broken up, causing the dye precursor to flow out, react with the developer, and render the images visible, completing the recording.

The range of application of conventional photosensitive compositions is, however, very limited because these photosensitive compositions have a much lower photopolymerization initiation capacity with respect to light sources in the visible range (above 400 nm) than in the ultraviolet range (400 nm and less).

A photosensitive composition with higher sensitivity in the visible range is needed for achieving faster scanning exposure with low-energy light.

Several proposals have been made concerning photosensitive compositions that are sensitive to visible light. Examples of such proposals include complex initiator systems containing dyes and aliphatic amines (Japanese Patent Publication No.44-20189); systems containing hexaarylbiimidazoles, radical-producing agents, and dyes (Japanese Patent Publication No.45-37377); systems containing hexaarylbiimidazoles and p-dialkylaminobenzylidene ketones (Japanese Patent Application Laid-open No.47-2528); systems containing cyclic cis-α-dicarbonyl compounds and dyes (Japanese Patent Application Laid-open No.48-84183); systems containing carbonyl compounds and tertiary amines (Japanese Patent Application Laid-open No.52-134692); systems containing substituted triazine and merocyanine pigments (Japanese Patent Application Laid-open No.54-151024); systems containing biimidazoles and indanones (Japanese Patent Application Laid-open No.54-155292); systems containing hexaarylbiimidazoles and p-dialkylaminostylbene derivatives (Japanese Patent Application Laid-open No.57-21401); systems containing hexaarylbiimidazoles and p-dialkylaminocinnamylidene derivatives (Japanese Patent Application Laid-open No.58-19315); systems containing triazine derivatives and cyanine dyes (Japanese Patent Application Laid-open No.58-29803); systems containing triazine derivatives and thiapyrillium salts (Japanese Patent Application Laid-open No.58-40302); systems containing hexaarylbiimidazoles and n-dialkylstilbene derivatives or of p-dialkylaminophenyl butadienyl derivatives and thiol compounds (Japanese Patent Application Laid-open No.59-56403); systems containing ketone-substituted derivatives and organic peroxides (Japanese Patent Application Laid-open No.60-32801); systems containing α-diketones and mercaptocarboxylic acids (Japanese Patent Application Laid-open No.61-258802); and systems containing α-diketones and polysulfides (Japanese Patent Application Laid-open No.61-258803).

Photosensitive compositions containing these systems can indeed be polymerized when exposed to visible light, but they do not necessarily yield adequate cured products. A need therefore exists for photosensitive compositions highly sensitive to visible light, as is a need for photopolymerization initiators highly sensitive to visible light.

SUMMARY OF THE INVENTION

An object of the present invention, which was perfected in order to overcome the above-described shortcomings, is to provide a fast-curing photosensitive composition in which adequate curing can be achieved even with low exposure energy by improving the sensitivity of the photosensitive composition to visible light, and to provide a recording sheet on which images can be recorded with high speed and on which clear images largely devoid of fogging can be obtained by the use of microcapsules containing this fast-curing photosensitive composition.

Aimed at attaining the stated object, the present invention provide a fast-curing photosensitive composition capable of being cured by the irradiation with light, comprising a radical-polymerizable unsaturated compound, a photopolymerization initiator, and a thiol-containing compound.

The fast-curing photosensitive composition of the present invention can provide adequate curing in a short time even with low exposure energy because it contains a radical-polymerizable unsaturated compound, a photopolymerization initiator for producing free radicals, and a thiol-containing compound that functions as a chain-transfer agent and that promotes chain propagation and addition reactions.

Using this fast-curing photosensitive composition in a recording sheet or the like will therefore allow images to be recorded at a high speed, and clear images largely devoid of fogging to be obtained.

Additionally, in the fast-curing photosensitive composition, as the radical-polymerizable unsaturated compound, there is preferably used a compound having at least one ethylenic unsaturated double bond, that is, a monomer suitable for a chain propagation and addition reaction initiated by free radicals. The fast-curing photosensitive composition using such a monomer can be adequately cured in a shorter time.

Furthermore, in the fast-curing photosensitive composition, as the photopolymerization initiator, there is preferably used a metal arene complex. Accordingly the polymerization reaction can be initiated and appropriately promoted, making it possible to cure the aforementioned fast-curing photosensitive composition in a shorter time even with low exposure energy.

Moreover, the fast-curing photosensitive composition preferably contains 0.01 to 20 weight parts photopolymerization initiator and 0.1 to 30 weight parts thiol-containing compound based on 100 weight parts radical-polymerizable unsaturated compound, and can thus be cured in a short time even with low exposure energy.

In addition, in a recording sheet in which there is supported on a support the photosensitive microcapsules inside which the fast-curing photosensitive composition is encapsulated, the fast-curing photosensitive composition inside the microcapsules can be adequately cured in a short time even with low-energy light such as visible light. Therefore, images which are clear and largely devoid of fogging can be recorded on the recording sheet at a high speed.

This and other objects, features and advantages of the present invention are described in or will become apparent from the following detailed description of the invention.

DETAILED DESCRIPTION OF THE INVENTION

The present invention will now be described in detail.

The fast-curing photosensitive composition of the present invention capable of being cured by the irradiation with light, comprises a radical-polymerizable unsaturated compound, a photopolymerization initiator, and a thiol-containing compound.

Examples of such radical-polymerizable unsaturated compounds (hereinafter referred to as "polymerizable substances") include compounds having at least one ethylenic unsaturated double bond (hereinafter referred to as "compounds having ethylenic unsaturated groups") and compounds having epoxy groups. Of these compounds having ethylenic unsaturated groups are particularly preferred, because these have comparatively high photopolymerization rates.

Examples of the compounds having ethylenic unsaturated groups include acrylic acid, salts thereof, acrylic acid esters, acrylamides, methacrylic acid, salts thereof, methacrylic acid esters, methacrylamides, maleic anhydride, maleic acid esters, itaconic acid esters, styrenes, vinyl ethers, vinyl esters, N-vinyl heterocycles, allyl ethers, allyl esters, and derivatives thereof. Of these, acrylic acid esters, methacrylic acid esters, and the like are preferred.

Specific examples of acrylic acid esters include butyl acrylate, cyclohexyl acrylate, ethyl hexyl acrylate, benzyl acrylate, furfuryl acrylate, ethoxyethyl acrylate, tricyclodecanyloxyacrylate, nonylphenyloxyethyl acrylate, hexanediol acrylate, 1,3-dioxolane acrylate, hexanediol diacrylate, butanediol diacrylate, neopentyl glycol diacrylate, polyethylene glycol diacrylate, tricyclodecane dimethylol diacrylate, tripropylene glycol diacrylate, bisphenol A diacrylate, pentaerythritol triacrylate, dipentaerythritol hexaacrylate, hexaacrylates of caprolactone-dipentaerythritol adducts, trimethylolpropane triacrylate, triacrylates of propylene oxide-trimethylol propane adducts, diacrylates of polyoxyethylenated bisphenol A, polyester acrylate, and polyurethane acrylate.

Specific examples of methacrylic acid esters include butyl methacrylate, cyclohexyl methacrylate, ethyl hexyl methacrylate, benzyl methacrylate, furfuryl methacrylate, ethoxyethyl methacrylate, tricyclodecanyloxymethacrylate, nonylphenyloxyethyl methacrylate, hexanediol methacrylate, 1,3-dioxolane methacrylate, hexanediol dimethacrylate, butanediol dimethacrylate, neopentyl glycol dimethacrylate, polyethylene glycol dimethacrylate, tricyclodecane dimethylol dimethacrylate, tripropylene glycol dimethacrylate, bisphenol A dimethacrylate, pentaerythritol trimethacrylate, dipentaerythritol hexamethacrylate, hexamethacrylates of caprolactone-dipentaerythritol adducts, trimethylolpropane trimethacrylate, trimethacrylates of propylene oxide-trimethylol propane adducts, dimethacrylates of polyoxyethylenated bisphenol A, polyester methacrylate, and polyurethane methacrylate.

Of these polymerizable substances, the use of at least one of the following compounds having three or more acryloyl groups (unsaturated groups) per molecule is particularly preferred: pentaerythritol triacrylate, dipentaerythritol hexaacrylate, hexaacrylates of caprolactone-dipentaerythritol adducts, trimethylol propane triacrylate, and triacrylates of propylene oxide-trimethylol propane adducts.

These polymerizable substances may be used individually or as a combination of two or more substances. Joint use of two or more such substances is preferred from the standpoint of promoting the polymerization reaction.

The photopolymerization initiator added to the aforementioned polymerizable substance produces radicals under irradiation with light and initiates a polymerization reaction involving the polymerizable substances.

Examples of the aforementioned photopolymerization initiators include aromatic carbonyl compounds, acetophenones, organic peroxides, diphenyl halonium salts, organic halides, 2,4,6-trisubstituted-S-triazines, 2,4,5-triarylimidazole dimers, azo compounds, dye borate complexes, metal arene complexes, and titanocene compounds.

Specific examples of the aforementioned photopolymerization initiators include benzophenone, benzil, xanthone, thioxanthone, anthraquinone, acetophenone, 2,2-dimethyl-2-morpholino-4'-methylthioacetophenone, benzoyl peroxide, 3,31,4,4$^1$-tetrakis (t-butyldioxycarbonyl) benzophenone, diphenyl iodonium bromide, diphenyl iodonium chloride, carbon tetrachloride, carbon tetrabromide, 2,4,6-tris(trichloromethyl)-S-triazine, and iron arene complexes. Of these, iron arene complexes are particularly preferred from the standpoint of sensitivity.

Examples of the aforementioned iron arene complexes include ($\eta^6$-benzene)($\eta^5$-cyclopentadienyl) iron(II)-hexafluorophosphate, ($\eta^6$-toluene)($\eta^5$-cyclopentadienyl) iron(II)-hexafluorophosphate, ($\eta^6$-cumene)($\eta^5$-cyclopentadienyl)iron(II)- hexafluorophosphate, ($\eta^6$-benzene)($\eta^5$-cyclopentadienyl) iron(II)-hexafluoroarsenate, ($\eta^6$-benzene)($\eta^5$-cyclopentadienyl)iron(II)-hexafluoroborate, ($\eta^6$-benzene) ($\eta^5$-cyclopentadienyl) iron (II)-hexafluoroantimonate, ($\eta^6$-naphthalene)($\eta^5$-cyclopentadienyl)iron(II)-hexafluorophosphate, ($\eta^6$-anthracene)($\eta^5$-cyclopentadienyl)iron(II)-hexafluorophosphate, ($\eta^6$-pyrene)($\eta^5$-cyclopentadienyl)iron (II)-hexafluorophosphate, and derivatives thereof.

These photopolymerization initiators may be used individually or as combinations of two or more components.

The content of the aforementioned photopolymerization initiators should preferably be 0.01 to 20 weight parts, and particularly 1 to 10 weight parts, per 100 weight parts of the polymerizable substance. A content below 0.01 weight part impairs the progress of the photopolymerization reaction, whereas a content above 20 weight parts fails to produce a commensurate increase in photosensitivity, and is hence uneconomical.

The aforementioned fast photosensitive composition contains a thiol-containing compound. It is believed that this thiol-containing compound functions as a chain-transfer agent.

The aforementioned thiol-containing compounds are not subject to any particular limitations as long as they have SH groups. Specific examples of such compounds include thioglycolic acid, ammonium thioglycolate, thioglycolic acid monoethanolamine, sodium thioglycolate, methyl thioglycolate, octyl thioglycolate, methoxybutyl thioglycolate, butanediol bisthioglycolate, ethylene glycol bisthioglycolate, trimethylolpropane tris(thioglycolate), pentaerythritol tetrakis(thioglycolate), 3-mercaptopropionic acid, methyl mercaptopropionic acid, octyl mercaptopropionic acid, methoxybutyl mercaptopropionic acid, tridecyl mercaptopropionic acid, butanediol bisthiopropionate, ethylene glycol bisthiopropionate, trimethylolpropane tristhiopropionate, pentaerythritol tetrakisthiopropionate, dipentaerythritol or trimethylol propane, and other esters of mercaptopropionic acid and polyhydric alcohols. These thiol-containing compounds may be used individually or as combinations of two or more compounds.

The content of the aforementioned thiol-containing compounds should preferably be 0.1 to 30 weight parts, and particularly 1 to 20 weight parts, per 100 weight parts of the polymerizable substance. A content below 0.1 weight part yields an inadequate improvement effect, whereas a content above 30 weight parts fails to ensure adequate curing and presents problems because of lower stability.

Photocuring energy is adopted as a standard for determining the amount of energy that promotes a photocuring reaction. The lower the photocuring energy is, the smaller is the amount of exposure energy needed to promote the curing of a photosensitive composition.

It is believed that a chain-transfer reaction is promoted by SH groups. For this reason, the photocuring energy is affected by the number of SH groups per molecule of the thiol-containing compound as well as by the chemical structure of the molecule. In principle, therefore, the amount of photocuring energy decreases with an increase in the number of SH groups at the same number of molecules.

The fast-curing photosensitive composition of the present invention may also contain photosensitizers, stabilizers (such as thermopolymerization inhibitors), compatibility improvers, pigments, and the like in addition to the aforementioned indispensable components. The fast-curing photosensitive composition can get a high-sensitivity by the addition of the aforementioned photosensitizers.

In addition, sensitizing dyes can be used jointly in order to improve the photosensitivity (and particularly the wavelength-related sensitivity characteristics) of the aforementioned fast-curing photosensitive composition. Examples of such sensitizing dyes include xanthene dyes, coumarin dyes, merocyanine dyes, thiazine dyes, azine dyes, methine dyes, oxazine dyes, phenylmethane dyes, cyanine dyes, azo dyes, anthraquinone dyes, pyrazoline dyes, stilbene dyes, and quinoline dyes.

In addition, pigments can be used as light color development substances. Pigments having adequate colors should be selected, in addition to commercially available products, from the products described in pigment handbooks and other written works (for example, "Saishin Ganryo Binran," Compiled by Nippon Ganryo Gijutsu Kyokai, 1977), and from products described in other literature. These pigments may be used in dispersed form.

In particular, the following pigments can be used to advantage: monoazo, disazo, azo calcium lake, and azo barium lake as yellow pigments; quinacridone and calcium lake as magenta pigments; and phthalocyanine and the like as cyan pigments.

In addition, organic solvents having appropriate polarity can be jointly used with the aim of adjusting the solubility of the aforementioned fast-curing photosensitive composition.

The aforementioned fast-curing photosensitive composition is not subject to any particular limitations in terms of its application and can be used in recording inks, photosensitive paints, and other applications. In particular, the fast-curing photosensitive composition of the present invention can be used to advantage as an enclosure for photocuring, photosensitive microcapsules designed for image-recording applications.

Such photosensitive microcapsules can be fabricated by methods that are already regarded as conventional techniques in the industry.

No particular limitations are imposed on the methods for manufacturing the aforementioned photosensitive microcapsules. Examples of such methods include phase separation from aqueous solutions, as described in U.S. Pat. No. 2,800,457, U.S. Pat. No. 2,800,458, and elsewhere; interfacial polymerization such as that described in Japanese Patent Publication No.38-19574, Japanese Patent Publication No.42-446, Japanese Patent Publication No.42-771, and elsewhere; in-situ techniques based on monomer polymerization, as described in Japanese Patent Publication No.36-9168, Japanese Patent Application Laid-open No.51-9079, and elsewhere; and melting, dispersion, and cooling techniques such as those described in UK Patent No.952807, UK Patent No.965074, and elsewhere. Of these methods, the in-situ techniques, which allow photosensitive microcapsules to be manufactured relatively simply, are preferred because the starting materials for wall members are supplied exclusively in water.

Either inorganic or organic substances can be used as the materials for forming the wall members of the photosensitive microcapsules as long as these wall members can be fabricated by the aforementioned methods for manufacturing photosensitive microcapsules. Materials with adequate light transmission capabilities are preferred.

Specific examples of the aforementioned microcapsules include gelatin, gum arabic, starch, sodium alginate, polyvinyl alcohol, polyethylene, polyamide, polyester, polyurethane, polyurea, polystyrene, nitrocellulose, ethyl cellulose, methyl cellulose, melamine/formaldehyde resin, urea/formaldehyde resin, and copolymers thereof.

Of the aforementioned members, melamine/formaldehyde resins or urea/formaldehyde resins that can be used in the aforementioned in-situ techniques are particularly preferred.

The fast-curing photosensitive composition to be made into an enclosure must be dispersed or emulsified in an aqueous medium when photosensitive microcapsules are fabricated by the aforementioned in-situ techniques or the like. It is preferable in this case to use nonionic or anionic water-soluble polymers as the emulsifiers for such an aqueous medium.

Examples of the aforementioned nonionic water-soluble polymers include polyvinyl alcohol, polyvinyl pyrrolidone, polyacrylamide, polymethyl vinyl ether, hydroxymethyl cellulose, and hydroxyethyl cellulose.

Examples of the aforementioned anionic water-soluble polymers include polystyrenesulfinic acid, polystyrene sulfonates, styrenesulfonic acid copolymers, polyvinylsulfonic acid ester salts, polyvinyl sulfonates, maleic anhydride/styrene copolymers, and maleic anhydride/isobutylene copolymers.

The recording sheet of the present invention can be obtained by supporting on a support the photosensitive microcapsules.

No particular restrictions are imposed on the methods for supporting the aforementioned photosensitive microcapsules on a support. An example is a method in which an emulsion containing photosensitive microcapsules is applied to a support and allowed to dry.

Examples of the support include paper, wood-free paper, coated paper, and other types of paper; polyester, polyethylene, polypropylene, acetyl cellulose, cellulose ester, polyvinyl acetal, polystyrene, polycarbonate, polyethylene terephthalate, polyimide, and other films or sheets; and synthetic paper composed of the aforementioned types of paper and the aforementioned films or sheets.

Of these, polyethylene terephthalate and other films are preferred because they have flat, smooth surfaces, exhibit excellent strength and the like, are thin at 0.05 mm or less, and occupy a relatively small volume even when rolled up.

In addition, products obtained by forming reflecting layers by aluminum vapor deposition or the like on at least one side of such films are effective in improving the photosensitivity of fast-curing photosensitive compositions, and are thus particularly preferred.

A hydrophilic binder should preferably be admixed into a photosensitive microcapsule dispersion when a solution containing the photosensitive microcapsules is applied to the aforementioned support to form a photosensitive layer.

Examples of such hydrophilic binders include gelatin, cellulose, starch, gum arabic, and other natural substances, as well as polyvinyl alcohol, polyvinyl pyrrolidone, polyacrylic acid, polymethacrylic acid, polyacrylamide, polyvinyl imidazole, polystyrenesulfonic acid, and other synthetic macromolecular substances.

The fast-curing photosensitive composition thus configured in accordance with the present invention is activated through the efficient absorption of visible light which the photopolymerization initiator is inherently incapable of absorbing or can absorb with extremely low absorbance. Specifically, it is believed that the thiol-containing compound contained in the fast-curing photosensitive composition of the present invention functions as a chain-transfer agent, promoting the chain propagation and addition reactions initiated by the radicals produced by the photopolymerization initiator. As a result, the photosensitive composition can be cured in a short time.

Thus, the fast-curing photosensitive composition pertaining to this embodiment can be adequately cured in a short time even with low exposure energy because this composition contains a radical-polymerizable unsaturated compound, a photopolymerization initiator, and a thiol-containing compound.

Images can therefore be recorded at a high speed, and clear images largely devoid of fogging can be obtained on the recording sheet in which the photosensitive microcapsules inside which the aforementioned fast-curing photosensitive composition encapsulated are supported on such a support.

EXAMPLES

The present invention will now be described in more detail by giving Examples, but the present invention is not limited by these Examples.

Examples 1 to 18

Dipentaerythritol hexaacrylate and phenyl glycidyl ether acrylate were mixed in a ratio of 1:1, and the following ingredients were used per 100 weight parts of the mixture: macromolecular polyurethane was used as a dispersant; a ketocoumarin dye, rhodamine dye, and cyanine dye were dispersed as sensitizing dyes in an amount of 0.3 weight part; 2,6-diisopropyl-N,N-dimethylaniline (1.5 weight parts) was added as a sensitizer; the iron arene complex ($\eta^5$-2,4-cyclopentadien-1 -yl) [$\eta^6$-(1-methylethyl)benzene]iron(II)-hexafluorophosphate (4 weight parts) was added as a polymerization initiator; the types of thiol-containing compounds shown in Tables 1 to 3 below were added (4 weight parts); and the ingredients were kept for 10 minutes at 100° C., yielding fast-curing photosensitive compositions.

The aforementioned fast-curing photosensitive compositions (100 g) were subsequently added to 100 cc of an aqueous solution containing an aqueous solution (emulsifier) comprising, in a 1:1 ratio, a 5% aqueous solution of a partial sodium salt of polystyrenesulfonic acid and a 5% aqueous solution of a styrene/maleic anhydride copolymer. The ingredients were agitated in a homogenizer for 5 minutes at 6000 rotations, yielding a so-called O/W emulsion in the form of an aqueous solution containing liquid components as liquid droplets measuring 5 to 20 $\mu$m.

Separately, a commercially available melamine powder was added to a 37% aqueous solution of formaldehyde, the pH was adjusted to 9.0 with the aid of a sodium hydroxide solution, and the system was kept for 30 minutes at a water temperature of 60° C., yielding a melamine/formaldehyde prepolymer.

The melamine/formaldehyde prepolymer was subsequently added to the O/W emulsion, and the system was heated to a water temperature of 80° C. and kept in this state for 5 hours while being agitated at 100 to 300 revolutions with the aid of an agitator-homomixer or the like. The system was then adjusted to a pH of 7 and cooled to normal temperature.

As a result, wall members composed of melamine/formaldehyde resin were precipitated around the droplets of the O/W emulsion, yielding an emulsion containing photosensitive microcapsules.

The emulsion containing these photosensitive microcapsules was subsequently applied to the surface of a polyester sheet and dried, yielding a recording sheet whose surface was coated with photosensitive microcapsules.

Examples 19 to 72

Emulsions containing fast-curing photosensitive compositions and photosensitive microcapsules were fabricated in the same manner as in Example 1, except that the content of the iron arene complex (photopolymerization initiator) was varied as shown in Tables 4 to 9, pentaerythritol tetrakisthiopropionate was used as the thiol-containing compound, and the addition amounts thereof was varied as shown in Tables 4 to 9. Recording sheets whose surfaces were coated with the photosensitive microcapsules were obtained by applying these emulsions to polyester sheet surfaces.

Comparative Examples 1 to 3

Emulsions containing fast-curing photosensitive compositions and photosensitive microcapsules were fabricated in the same manner as in Example 1, except that the aforementioned thiol-containing compound was not used. Recording sheets whose surfaces were coated with the photosensitive microcapsules were obtained by applying these emulsions to polyester sheet surfaces.

Evaluation

The recording sheets obtained in the above-described Examples and Comparative Examples were exposed to light with the aid of a spectral sensitivity meter to cure the fast-curing photosensitive compositions inside the photosensitive microcapsules in the exposed areas. The sheets were then superposed onto image-receiving paper and pressed to form images.

Photocuring energy was measured based on the following: the curing height of the images at maximum curing wavelength, the irradiation energy emitted by the light source at this wavelength, and the exposure time. The photocuring energy measured was used as a measure of curing properties.

The ketocoumarin dyes, rhodamine dyes, and cyanine dyes in the coating films in the recording sheets were yellow, red and green, respectively. The coating films therefore revealed peak sensitivities for blue, green, and red light, photocuring energy was measured at wavelengths of 450 nm, 550 nm, and 650 nm with the aid of a spectral sensitivity meter.

Tables 1 to 3 show the evaluation results, the addition amounts of the iron arene complex, and the types and addition amounts of the thiol-containing compounds obtained in Examples 1 to 18 and Comparative Examples 1 to 3.

In addition, Tables 4 to 9 show the evaluation results, the addition amounts of the iron arene complex, and the addition amounts of the thiol-containing compounds in Examples 19 to 72.

TABLE 1

Curing Energy at Wavelength 450 nm

| | Thiol-containing compound | | Addition amount of iron arene complex (weight parts) | Curing energy (erg/cm$^2$) |
|---|---|---|---|---|
| | Type | Addition amount (weight parts) | | |
| Example 1 | Pentaerythritol tetrakisthiopropionate | 4 | 4 | 550 |
| Example 2 | Ethylene glycol bisthioglycolate | 4 | 4 | 600 |
| Example 3 | Methoxybutyl thioglycolate | 4 | 4 | 660 |
| Example 4 | Pentaerythritol tetrakisthioglycolate | 4 | 4 | 580 |
| Example 5 | Octyl mercaptopropionate | 4 | 4 | 720 |
| Example 6 | Butanediol bisthiopropionate | 4 | 4 | 770 |
| Comparative Example 1 | No addition | 0 | 4 | 2100 |

TABLE 2

Curing Energy at Wavelength 550 nm

| | Thiol-containing compound | | Addition amount of iron arene complex (weight parts) | Curing energy (erg/cm$^2$) |
|---|---|---|---|---|
| | Type | Addition amount (weight parts) | | |
| Example 7 | Pentaerythritol tetrakisthiopropionate | 4 | 4 | 570 |
| Example 8 | Ethylene glycol bisthioglycolate | 4 | 4 | 610 |
| Example 9 | Methoxybutyl thioglycolate | 4 | 4 | 660 |
| Example 10 | Pentaerythritol tetrakisthioglycolate | 4 | 4 | 620 |
| Example 11 | Octyl mercaptopropionate | 4 | 4 | 660 |
| Example 12 | Butanediol bisthiopropionate | 4 | 4 | 590 |
| Comparative Example 2 | No addition | 0 | 4 | 2300 |

TABLE 3

Curing Energy at Wavelength 650 nm

| | Thiol-containing compound | | Addition amount of iron arene complex (weight parts) | Curing energy (erg/cm$^2$) |
|---|---|---|---|---|
| | Type | Addition amount (weight parts) | | |
| Example 13 | Pentaerythritol tetrakisthiopropionate | 4 | 4 | 600 |
| Example 14 | Ethylene glycol bisthioglycolate | 4 | 4 | 710 |
| Example 15 | Methoxybutyl thioglycolate | 4 | 4 | 730 |
| Example 16 | Pentaerythritol tetrakisthioglycolate | 4 | 4 | 650 |
| Example 17 | Octyl mercaptopropionate | 4 | 4 | 700 |
| Example 18 | Butanediol bisthiopropionate | 4 | 4 | 730 |
| Comparative Example 3 | No addition | 0 | 4 | 2800 |

TABLE 4

Curing Energy at Wavelength 450 nm

| | Addition amount of thiol-containing compound (weight parts) | Addition amount of iron arene complex (weight parts) | Curing energy (erg/cm$^2$) |
|---|---|---|---|
| Example 19 | 1 | 0.01 | 2000 |
| Example 20 | 1 | 4 | 1800 |
| Example 21 | 1 | 20 | 1600 |
| Example 22 | 4 | 0.01 | 1800 |
| Example 23 | 4 | 4 | 550 |
| Example 24 | 4 | 20 | 1400 |
| Example 25 | 10 | 0.01 | 1500 |
| Example 26 | 10 | 4 | 400 |
| Example 27 | 10 | 20 | 1200 |

TABLE 5

Curing Energy at Wavelength 450 nm

| | Addition amount of thiol-containing compound (weight parts) | Addition amount of iron arene complex (weight parts) | Curing energy (erg/cm$^2$) |
|---|---|---|---|
| Example 28 | 0.1 | 1 | 2000 |
| Example 29 | 4 | 1 | 1800 |
| Example 30 | 30 | 1 | 1400 |
| Example 31 | 0.1 | 4 | 1900 |
| Example 32 | 4 | 4 | 550 |
| Example 33 | 30 | 4 | 400 |
| Example 34 | 0.1 | 10 | 1900 |
| Example 35 | 4 | 10 | 1700 |
| Example 36 | 30 | 10 | 600 |

TABLE 6

Curing Energy at Wavelength 550 nm

| | Addition amount of thiol-containing compound (weight parts) | Addition amount of iron arene complex (weight parts) | Curing energy (erg/cm$^2$) |
|---|---|---|---|
| Example 37 | 1 | 0.01 | 2100 |
| Example 38 | 1 | 4 | 1900 |
| Example 39 | 1 | 20 | 1800 |
| Example 40 | 4 | 0.01 | 2000 |
| Example 41 | 4 | 4 | 570 |
| Example 42 | 4 | 20 | 1500 |
| Example 43 | 10 | 0.01 | 1600 |
| Example 44 | 10 | 4 | 500 |
| Example 45 | 10 | 20 | 1200 |

TABLE 7

Curing Energy at Wavelength 550 nm

| | Addition amount of thiol-containing compound (weight parts) | Addition amount of iron arene complex (weight parts) | Curing energy (erg/cm$^2$) |
|---|---|---|---|
| Example 46 | 0.1 | 1 | 2100 |
| Example 47 | 4 | 1 | 1900 |
| Example 48 | 30 | 1 | 1700 |
| Example 49 | 0.1 | 4 | 1900 |
| Example 50 | 4 | 4 | 570 |
| Example 51 | 30 | 4 | 450 |
| Example 52 | 0.1 | 10 | 1800 |
| Example 53 | 4 | 10 | 2000 |
| Example 54 | 30 | 10 | 820 |

TABLE 8

Curing Energy at Wavelength 650 nm

| | Addition amount of thiol-containing compound (weight parts) | Addition amount of iron arene complex (weight parts) | Curing energy (erg/cm$^2$) |
|---|---|---|---|
| Example 55 | 1 | 0.01 | 2500 |
| Example 56 | 1 | 4 | 2000 |
| Example 57 | 1 | 20 | 1900 |
| Example 58 | 4 | 0.01 | 2400 |
| Example 59 | 4 | 4 | 600 |
| Example 60 | 4 | 20 | 1700 |
| Example 61 | 10 | 0.01 | 2000 |
| Example 62 | 10 | 4 | 520 |
| Example 63 | 10 | 20 | 1400 |

TABLE 9

Curing Energy at Wavelength 650 nm

| | Addition amount of thiol-containing compound (weight parts) | Addition amount of iron arene complex (weight parts) | Curing energy (erg/cm$^2$) |
|---|---|---|---|
| Example 64 | 0.1 | 1 | 2700 |
| Example 65 | 4 | 1 | 2100 |
| Example 66 | 30 | 1 | 2000 |
| Example 67 | 0.1 | 4 | 2300 |
| Example 68 | 4 | 4 | 600 |
| Example 69 | 30 | 4 | 470 |
| Example 70 | 0.1 | 10 | 2200 |
| Example 71 | 4 | 10 | 2200 |
| Example 72 | 30 | 10 | 1100 |

It is evident from the results in Tables 1 to 9 that the recording sheets of Examples 1 to 72, which were obtained using fast-curing photosensitive compositions containing added thiol-containing compounds, had lower photocuring energy and could be photopolymerized and cured with lower energy than the recording sheets of Comparative Examples 1 to 3, which were obtained using photosensitive compositions devoid of thiol-containing compounds.

Therefore, the fast-curing photosensitive compositions of the present embodiments have higher curing speed at the same exposure energy.

The results of the embodiments described above indicate that the use of the fast-curing photosensitive composition of the present invention can yield a fast-curing photosensitive composition that combines high sensitivity and adequate curing properties.

From the above description, it is evident that the fast-curing photosensitive composition of the present invention can provide a photosensitive composition that is highly sensitive to light and that can develop adequate curing properties for image recording in a short time. Consequently, images can be recorded with high speed, and clear images largely devoid of fogging be obtained, by the use of such fast-curing photosensitive compositions.

In addition, the fast-curing photosensitive composition using as the radical-polymerizable unsaturated compound a compound having at least one ethylenic unsaturated double bond is highly sensitive to light and can develop adequate curing properties for image recording in a short time.

Furthermore, polymerization reactions can be appropriately promoted and the aforementioned fast-curing photosensitive composition cured in a shorter time even with low exposure energy by the use of a metal arene complex as the photopolymerization initiator in the fast-curing photosensitive composition.

When the fast-curing photosensitive composition contains 0.01 to 20 weight parts photopolymerization initiator and 0.1 to 30 weight parts thiol-containing compound per 100 weight parts radical-polymerizable unsaturated compound, it can provide practically acceptable photosensitivity and curing properties.

The recording sheet of the present invention, in which the fast-curing photosensitive composition is encapsulated inside the microcapsules, can be adequately cured in a short time even with low-energy light such as visible light. On the recording sheet, clear images largely devoid of fogging can be recorded with high speed.

The entire disclosure of the specification, claims and of Japanese Patent Application No. 9-365770 filed on Dec. 22, 1997 is hereby incorporated by reference in its entirety.

What I claim is:

1. A fast-curing photosensitive composition capable of being cured by irradiation with visible light, comprising a radical-polymerizable unsaturated compound, a photopolymerization initiator, and a thiol-containing compound, and wherein the composition is encapsulated within a photosensitive microcapsule, and wherein the thiol-containing compound is selected from the group consisting of pentaeryritol tetrakisthiopropionate, ethylene glycol bisthioglycolate, methoxybutyl thioglycolate, pentaerythritol tetrakisthioglycolate, octyl mercaptopropionate, and butanediol bisthiopropionate.

2. The fast-curing photosensitive composition according to claim 1, wherein the radical-polymerizable unsaturated compound is a compound having at least one ethylenic unsaturated double bond.

3. The fast-curing photosensitive composition according to claim 2, wherein the compound having at least one ethylenic unsaturated double bond is a compound having three or more acryloyl groups per molecule.

4. The fast-curing photosensitive composition according to claim 3, wherein the compound having three or more acryloyl groups per molecule is at least one of pentaerythritol triacrylate, dipentaerythritol hexaacrylate, hexaacrylates of caprolactone-dipentaerythritol adducts, trimethylol propane triacrylate, and triacrylates of propylene oxide-trimethylol propane adducts.

5. The fast-curing photosensitive composition according to claim 1, wherein the photopolymerization initiator is a metal arene complex.

6. The fast-curing photosensitive composition according to claim 5, wherein the metal arene complex is at least one of ($\eta^6$-benzene)($\eta^5$-cyclopentadienyl) iron(II)-hexafluorophosphate, ($\eta^6$-toluene)($\eta^5$-cyclopentadienyl) iron(II)-hexafluorophosphate, ($\eta^6$-cumene)($\eta^5$-cyclopentadienyl)iron(II)-hexafluorophosphate, ($\eta^6$-benzene)($\eta^5$-cyclopentadienyl) iron(II)-hexafluoroarsenate, ($\eta^6$-benzene)($\eta^5$-cyclopentadienyl)iron(II)-hexafluoroborate, ($\eta^6$-benzene)($\eta^5$-cyclopentadienyl) iron (II)-hexafluoroantimonate, ($\eta^6$-naphthalene)($\eta^5$-cyclopentadienyl)iron(II)-hexafluorophosphate, ($\eta^6$-anthracene)($\eta^5$-cyclopentadienyl)iron(II)-hexafluorophosphate, and ($\eta^6$-pyrene)($\eta^5$-cyclopentadienyl)iron(II)-hexafluorophosphate, and derivatives thereof.

7. The fast-curing photosensitive composition according to claim 1, comprising 0.01 to 20 weight parts of the photopolymerization initiator and 0.1 to 30 weight parts of the thiol-containing compound per 100 weight parts of the radical-polymerizable unsaturated compound.

8. The fast-curing photosensitive composition according to claim 7, comprising 1 to 10 weight parts of the photopolymerization initiator and 1 to 20 weight parts of the thiol-containing compound per 100 weight parts of the radical-polymerizable unsaturated compound.

9. A recording sheet, comprising a support and fast-curing photosensitive composition according to claim 1 encapsulated inside the photosensitive microcapsules supported on the support.

10. A fast-curing photosensitive composition capable of being cured by irradiation with light, comprising a radical-polymerizable unsaturated compound, a photopolymerization initiator, and a thiol-containing compound;

wherein the radical-polymerizable unsaturated compound is an acrylic acid ester or a methacrylic acid ester:

wherein the photopolymerization initiator is an iron arene complex;

wherein the thiol-containing compound is selected from the group consisting of pentaerythritol tetrakisthiopropionate, ethylene glycol bisthioglycolate, methoxybutyl thioglycolate pentaerythritol tetrakisthioglycolate, octyl mercaptopropionate and butanediol bisthiopropionate, and wherein the composition comprises 0.01 to 20 weight parts of the photopolymerization initiator and 0.1 to 30 weight parts of the thiol-containing compound per 100 weight parts of the radical-polymerizable unsaturated compound.

11. The fast-curing composition of claim 10, wherein the radical-polymerizable compound having at least one ethylenic unsaturated double bond and having three or more acryloyl groups per molecule.

12. The fast-curing composition of claim 11, wherein the compound having three or more accryloyl groups per molecule is at least one of pentaerythritol triacrylate, dipentaerythritol hexaacrylate, hexaacrylates of caprolactone-dipentaerythritol adducts, trimethylol propane triacrylate, and triacrylates of propylene oxide-trimethoylol propane adducts.

13. The fast-curing composition of claim 10, wherein the iron arene complex is at least one of ($\eta^6$-benzene) ($\eta^5$-cyclopentadienyl) iron (II)-hexafluorophosphate, ($\eta^6$-toluene) ($\eta^5$-cyclopentadienyl), iron (II)-hexafluorophosphate, ($\eta^6$-cumene) ($\eta^5$-cyclopentadienyl) iron (II)-hexafluorophosphate, ($\eta^6$-benzene) ($\eta^5$-cyclopentadienyl) iron (II)-hexafluoroarsenate, ($\eta^6$-benzene) ($\eta^5$-cyclopentadienyl) iron (II)-hexafluoroborate, ($\eta^6$-benzene) ($\eta^5$-cyclopentadienyl) iron (II)-hexafluoroantimonate, ($\eta^6$-napthalene) ($\eta^5$-cyclopentadienyl) iron (II)-hexafluorphosphate, ($\eta^6$-anthracene) ($\eta^5$-cyclopentadienyl) iron (II)-hexafluorophosphate, and ($\eta^6$-pyrene) ($\eta^5$-cyclopentadienyl) iron (II)-hexafluorophosphate, and derivatives thereof.

14. The fast-curing composition of claim 10, comprising 1 to 10 weight parts of the photopolymerization initiator and 1 to 20 weight parts of the thiol-containing compound per 100 weight parts of the radical-polymerizable unsaturated compound.

15. The fast-curing composition of claim 10, further comprising a sensitizing dye.

16. The fast-curing composition of claim 10, wherein the composition can be cured by visible light.

* * * * *